United States Patent
Ahn et al.

(10) Patent No.: US 9,923,039 B2
(45) Date of Patent: Mar. 20, 2018

(54) DISPLAY PANELS, METHODS OF MANUFACTURING THE SAME AND ORGANIC LIGHT EMITTING DISPLAY DEVICES HAVING THE SAME

(71) Applicant: Samsung Display Co., LTD., Yongin, Gyeonggi-Do (KR)

(72) Inventors: Ki-Wan Ahn, Seoul (KR); Yong-Jae Jang, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 178 days.

(21) Appl. No.: 14/596,556

(22) Filed: Jan. 14, 2015

(65) Prior Publication Data
US 2016/0027853 A1    Jan. 28, 2016

(30) Foreign Application Priority Data

Jul. 28, 2014  (KR) .................. 10-2014-0095611

(51) Int. Cl.
*H01L 27/14*    (2006.01)
*H01L 27/32*    (2006.01)
*H01L 27/12*    (2006.01)

(52) U.S. Cl.
CPC ........ *H01L 27/3262* (2013.01); *H01L 27/127* (2013.01)

(58) Field of Classification Search
CPC ............. H01L 27/1214; H01L 27/1237; H01L 27/1251
See application file for complete search history.

(56) References Cited

U.S. PATENT DOCUMENTS

| 7,303,981 | B2 * | 12/2007 | Hsu ..................... H01L 21/2026 257/E27.111 |
| 8,101,979 | B2 * | 1/2012 | Choi ................... H01L 27/1214 257/184 |
| 9,006,043 | B2 * | 4/2015 | Ohnuma ............. H01L 21/0273 257/59 |
| 2012/0327032 | A1 | 12/2012 | Jeon et al. |
| 2013/0088460 | A1 | 4/2013 | Ahn et al. |
| 2014/0022289 | A1 | 1/2014 | Lee et al. |

FOREIGN PATENT DOCUMENTS

| KR | 10-2013-0000220 A | 1/2013 |
| KR | 10-2013-0037072 A | 4/2013 |
| KR | 10-2013-0058405 A | 6/2013 |

\* cited by examiner

*Primary Examiner* — Mark Prenty
(74) *Attorney, Agent, or Firm* — Knobbe Martens Olson & Bear LLP

(57) ABSTRACT

A display device includes a substrate and first, second and third thin film transistor. The first thin film transistor is disposed over the substrate, and includes a first gate electrode which has a first transmittance. The second thin film transistor is disposed over the substrate, and includes a second gate electrode which has a second transmittance substantially different from the first transmittance. The third thin film transistor is disposed over the substrate, and includes a third gate electrode which has a third transmittance substantially different from the first transmittance.

10 Claims, 8 Drawing Sheets

DISPLAY PANELS, METHODS OF MANUFACTURING THE SAME AND ORGANIC LIGHT EMITTING DISPLAY DEVICES HAVING THE SAME

CROSS-REFERENCE TO RELATED APPLICATION(S)

This application claims priority under 35 U.S.C. § 119 to Korean patent Application No. 10-2014-0095611, filed on Jul. 28, 2014, the disclosure of which is hereby incorporated by reference herein in its entirety.

BACKGROUND

1. Technical Field

Example embodiments of the invention relate to display panels, methods of manufacturing display panels and organic light emitting display devices having display panels.

2. Description of the Related Art

Generally, a display device, for example, an organic light emitting display device, includes an array of pixels. To drive or control the operation of each pixel of the display device, one or more semiconductor devices, for example, thin film transistors, are provided for each pixel. In an organic light emitting display device, the semiconductor devices are provided for controlling electric currents flowing through the organic light emitting structure based on the data signals.

SUMMARY

Example embodiments provide a display panel including a plurality of gate electrodes having different transmittances to improve characteristics such as a light sensing ability, a reliability, etc.

Example embodiments provide a method of manufacturing the display panel.

Example embodiments provide an organic light emitting display device including the display panel.

According to one aspect of the invention, a display panel may include a substrate comprising a major surface having a first region, a second region and a third region when viewed in a direction perpendicular to the major surface. A first semiconductor device may be disposed over the first region of the substrate and comprise a first gate electrode. The first gate electrode of the first semiconductor device may have a first transmittance. A second semiconductor device may be disposed over the second region of the substrate and comprise a second gate electrode. The second gate electrode of the second semiconductor device may have a second transmittance substantially different from the first transmittance. A third semiconductor device may be disposed over the third region of the substrate and comprise a third gate electrode. The third gate electrode of the third semiconductor device may have a third transmittance substantially different from the first transmittance.

In example embodiments, the first transmittance may be substantially greater than the second transmittance and the third transmittance. For example, the second transmittance may be substantially the same as the third transmittance. Alternatively, the second transmittance may be substantially different from the third transmittance.

In example embodiments, the first semiconductor device may include a first active layer portion, a gate insulation layer covering the first active layer portion, a first gate electrode disposed over the gate insulation layer, and a first source electrode and a first drain electrode contacting the first active layer portion. The first gate electrode may include a substantially transparent conductive material. The second semiconductor device may include a second active layer portion, the gate insulation layer covering the second active layer portion, a second gate electrode disposed over the gate insulation layer, and a second source electrode and a second drain electrode contacting the second active layer portion. The second gate electrode may include a first gate electrode layer portion and a second gate electrode layer portion. The first gate electrode layer portion may include a substantially transparent conductive material, and the second gate electrode layer portion may include a substantially opaque conductive material. The third semiconductor device may include a third active layer portion, the gate insulation layer covering the third active layer portion, a third gate electrode disposed over the gate insulation layer, and a third source electrode and a third drain electrode contacting the third active layer portion. The third gate electrode may include a third gate electrode layer portion and a fourth gate electrode layer portion. The third gate electrode layer portion may include a substantially transparent conductive material and the fourth gate electrode layer portion may include a substantially opaque conductive material. For example, the substantially transparent conductive material may include indium tin oxide, indium zinc oxide, zinc oxide, tin oxide, gallium oxide, indium oxide, etc. Additionally, the substantially opaque conductive material may include chromium (Cr) based-metal, aluminum (Al) based-metal, silver (Ag) based-metal, tin (Sn) based-metal, molybdenum (Mo) based-metal, iron (Fe) based-metal, platinum (Pt) based-metal, or mercury (Hg) based-metal, etc.

In some example embodiments, the second semiconductor device may include a second active layer portion, the gate insulation layer covering the second active layer portion, a second gate electrode disposed over the gate insulation layer, and a second source electrode and a second drain electrode contacting the second active layer portion. The second gate electrode may include a substantially opaque conductive material.

In some example embodiments, the third semiconductor device may include a third active layer portion, the gate insulation layer covering the third active layer portion, a third gate electrode disposed over the gate insulation layer, and a third source electrode and a third drain electrode contacting the third active layer portion. The third gate electrode may include an substantially opaque conductive material According to another aspect of the invention, a method of manufacturing a display panel is provided. In the method, a substrate having a first region, a second region, and a third region may be provided. A first active layer portion may be formed to overlap the first region. A second active layer portion may be formed to overlap the second region. A third active layer portion may be formed to overlap the third region. A gate insulation layer may be formed over the substrate to cover the first active layer portion, the second active layer portion and the third active layer portion. A first gate electrode substantially overlaps the first active layer portion when viewed in the direction. A second gate electrode substantially overlaps the second active layer portion when viewed in the direction. A third gate electrode substantially overlaps the third active layer portion when viewed in the direction. A first source electrode and a first drain electrode may be formed to contact the first active layer portion. A second source electrode and a second drain electrode may be formed to make contact with the second active layer portion. A third source electrode and a third drain electrode may be formed to contact the third active layer portion may be formed.

In the formation of the first electrode according to example embodiments, a first electrode material layer may be formed over the gate insulation layer. A second electrode material layer may be formed over the first electrode layer. The first electrode material layer and the second electrode material layer may be partially etched using a half-ton mask or a half-ton slit mask formed over the second electrode material layer to form a first patterned portion comprising a first electrode material layer portion and a second electrode layer portion disposed over the first electrode material layer portion. The second electrode material layer portion of the first patterned portion, thereby forming the first gate electrode may be removed.

In the formations of the second gate electrode and the third gate electrode according to example embodiments, a first electrode material layer may be formed over the gate insulation layer. A second electrode material layer may be formed over the first electrode material layer. The first electrode material layer and the second electrode material layer may be etched. For example, the first electrode material layer and the second electrode layer may be etched using a half-ton mask or a half-ton slit mask.

In the formation of the first gate electrode according to some example embodiments, a first electrode material layer may be formed over the gate insulation layer. The first electrode material layer may be partially etched to form a first gate electrode over the gate insulation layer over the first region of the substrate.

In the formation of the first and second gate electrodes according to some example embodiments, a first electrode material layer may be formed on the gate insulation layer. The first electrode material layer may be partially etched to form the first gate electrode over the gate insulation layer over the first region of the substrate. Subsequently, a second electrode material layer may be formed over the gate insulation layer to cover the first gate electrode. The second electrode material layer may be partially etched to form the second gate electrode over the gate insulation layer over the second region of the substrate.

In the formation of the first and third gate electrodes according to some example embodiments, a first electrode material layer may be formed over the gate insulation layer. The first electrode material layer may be partially etched to form the first gate electrode over the gate insulation layer over the first region of the substrate. Subsequently, a second electrode material layer may be formed over the gate insulation layer to cover the first gate electrode layer portion. The second electrode material layer may be partially etched to form the third gate electrode over the gate insulation layer over the third region of the substrate.

In example embodiments, the first gate electrode may have a first transmittance, the second gate electrode has a second transmittance substantially different from the first transmittance, and the third gate electrode has a third transmittance substantially different from the first transmittance.

According to still another aspect of the invention, an organic light emitting display device may include the foregoing display panel, a first electrode disposed over the substrate and electrically contacting the third semiconductor device, an organic light emitting structure disposed over the first electrode, and a second electrode disposed over the organic light emitting structure.

A further aspect of the invention provides a display device including a substrate and first, second and third thin film transistor. The first thin film transistor is disposed over the substrate, and includes a first gate electrode which has a first transmittance. The second thin film transistor is disposed over the substrate, and includes a second gate electrode which has a second transmittance substantially different from the first transmittance. The third thin film transistor is disposed over the substrate, and includes a third gate electrode which has a third transmittance substantially different from the first transmittance.

According to example embodiments, the display panel may include the plurality of the gate electrodes (e.g., the first gate electrode, the second gate electrode, and the third gate electrode). The display panel may include the first semiconductor device having the first transmittance, the second semiconductor device having the second transmittance, and the third semiconductor device having the third transmittance. The first gate electrode of the first semiconductor device may efficiently transmit a light emitted from an organic light emitting structure, so that the first semiconductor device may have an improved light sensing ability when the first semiconductor device serves as a light sensing transistor of a display device. In addition, each of the second gate electrode of the second semiconductor device and the third gate electrode of the third semiconductor device may reflect the light emitted from the organic light emitting structure, such that photo currents due to the light emitted from the organic light emitting structure may be reduced. The second gate electrode of the second semiconductor device and the third gate electrode of the third semiconductor device may have multi-layered structures, threshold voltages of the second and the third semiconductor devices may be substantially uniformly maintained. As a result, each of the second and the third semiconductor devices may have an enhanced reliability.

BRIEF DESCRIPTION OF THE DRAWINGS

Illustrative, non-limiting example embodiments will be more clearly understood from the following detailed description taken in conjunction containing the accompanying drawings.

DETAILED DESCRIPTION OF EMBODIMENTS

Hereinafter, display panels, methods of manufacturing display panels and organic light emitting display devices having display panels in accordance with example embodiments will be explained in detail with reference to the accompanying drawings.

Figure 1:
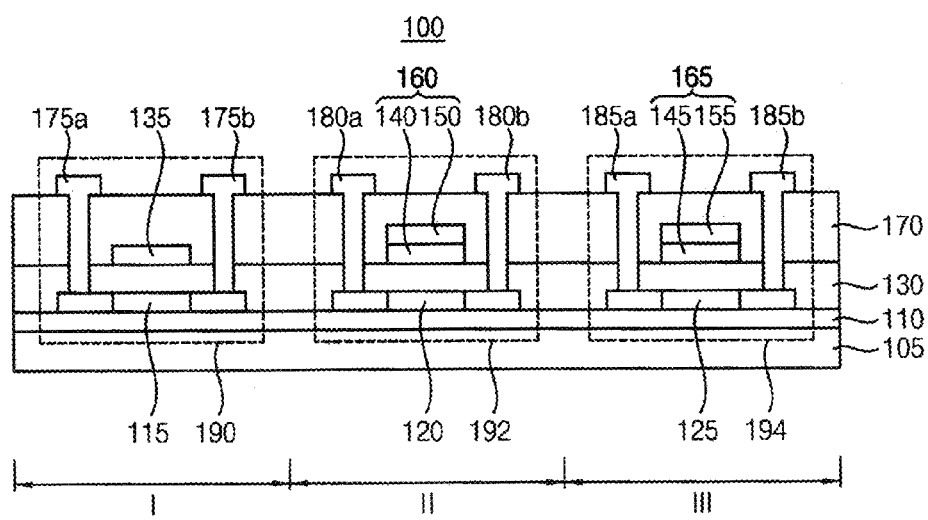
FIG. 1 is a cross sectional view illustrating a display panel in accordance with example embodiments.

FIG. 1 is a cross-sectional view illustrating a display device in accordance with example embodiments.

Referring to FIG. 1, a display panel 100 may include a substrate 105, a first semiconductor device 190, a second semiconductor device 192, a third semiconductor device 194, etc. In embodiments, a display device includes an array of pixels. Each pixel may include a display element, for example, an organic light emitting element, and the first, second and third semiconductor devices for controlling the operation of the display element. Such display elements of the pixels and other structures may be built on or over the display panel 100.

The substrate 105 may include a transparent insulation material. In example embodiments, the substrate 105 may have a first region I, a second region II and a third region III. As illustrated in FIG. 1, the second region II may be adjacent to the first region I and the third region III may be adjacent to the second region II.

A buffer layer 110 may be disposed on the substrate 105. The buffer layer 110 may improve the surface flatness of the substrate 105 when the substrate 105 may have relatively irregular surface.

The first semiconductor device 190 may include a first active layer portion 115, a gate insulation layer 130, a first gate electrode 135, an insulating interlayer 170, a first source electrode 175a, and a first drain electrode 175b. The first source electrode 175a and the first drain electrode 175b may pass through the gate insulation layer 130 and the insulating interlayer 170 to make contact with the first active layer portion 115. Here, the first active layer portion 115, the gate insulation layer 130, the first gate electrode 135, the insulating interlayer 170, the first source electrode 175a, and the first drain electrode 175b may be sequentially stacked in the first region I of the substrate 105.

The second semiconductor device 192 may include a second active layer portion 120, the gate insulation layer 130, a second gate electrode 160, the insulating interlayer 170, a second source electrode 180a, and a second drain electrode 180b. The second source and drain electrodes 180a and 180b may pass through the gate insulation layer 130 and the insulating interlayer 170 to make contact with the second active layer portion 120. In this case, the second active layer portion 120, the gate insulation layer 130, the second gate electrode 160, the insulating interlayer 170, the second source electrode 180a, and the second drain electrode 180b may be sequentially stacked in the second region II of the substrate 105.

The third semiconductor device 192 may include a third active layer portion 125, the gate insulation layer 130, a third gate electrode 165, the insulating interlayer 170, a third source electrode 185a, and a third drain electrode 185b. The third source and drain electrodes 185a and 185b may pass through the gate insulation layer 130 and the insulating interlayer 170 to make contact with the third active layer portion 125. The third active layer portion 125, the gate insulation layer 130, the third gate electrode 165, the insulating interlayer 170, the third source electrode 185a, and the third drain electrode 185b may be sequentially stacked in the third region III of the substrate 105. In example embodiments, the first gate electrode 135, the second gate electrode 160 and the third gate electrode 165 may have substantially different transmittances, respectively. The transmittances of the first to the third gate electrodes 135, 160 and 165 will be described below.

The first active layer portion 115 may be disposed on the buffer layer 110 positioned on the substrate 105 in the first region I. The first active layer portion 115 may include silicon. Alternatively, the first active layer portion 115 may include oxide semiconductor.

The second active layer portion 120 may be disposed on the buffer layer 110 located on the substrate 105 in the second region II. The second active layer portion 120 may include a material substantially the same as that of the first active layer portion 115.

The third active layer portion 125 may be disposed on the buffer layer 110 positioned on the substrate 105 in the third region III. The third active layer portion 125 may include a material substantially the same as that of the first active layer portion 115 and/or that of the second active layer portion 120.

The gate insulation layer 130 may be disposed on the buffer layer 110 to cover the first active layer portion 125, the second active layer portion 120 and the third active layer portion 125. The gate insulation layer 130 may include silicon compound such as silicon oxide, silicon carbon oxide, etc.

The first gate electrode 135 may be disposed on the gate insulation layer 130 in the first region I. The first gate electrode 135 may be positioned on a portion of the gate insulation layer 130 under which the first active layer portion 115 is located. That is, the first gate electrode 135 may be substantially overlapped over the first active layer portion 115 by interposing the gate insulation layer 130 therebetween. In example embodiments, the first gate electrode 135 may include a transparent conductive material. The first gate electrode 135 may include a material having a relatively high light transmittance. Examples of the material for the first gate electrode 135 may include indium tin oxide, indium zinc oxide, zinc oxide, tin oxide, gallium oxide, indium oxide, etc. These may be used alone or in a combination thereof.

In example embodiments, the first gate electrode 135 may have a first transmittance. As described above, since the first gate electrode 135 may include the material having the relatively high light transmittance, the first transmittance of the first gate electrode 135 may be substantially greater than a second transmittance of the second gate electrode 160 and a third transmittance of the third gate electrode 165. Thus, the first gate electrode 135 may efficiently transmit a light emitted from an organic light emitting structure, so that the first semiconductor device 190 may have an improved light sensing efficiency.

A first gate electrode layer portion 140 may be disposed on the gate insulation layer 130 in the second region II. The first gate electrode layer portion 140 may be substantially overlapped over the second active layer portion 120 by interposing the gate insulation layer 130 therebetween. In example embodiments, the first gate electrode layer portion 140 may include a material substantially the same as that of the first gate electrode 135. A second gate electrode layer portion 150 may be disposed on the first gate electrode layer portion 140. Thus, the second gate electrode 160 may have a configuration in which the first gate electrode layer portion 140 and the second gate electrode layer portion 150 are sequentially stacked. In example embodiments, the second gate electrode layer portion 150 may include a substantially opaque conductive material. The second gate electrode layer portion 150 may include a material having a light transmittance substantially lower than that of the first gate electrode 135. For example, the second gate electrode layer portion 150 may include metal, alloy, metal nitride, conductive metal oxide, etc. Examples of the metal for the second gate electrode layer portion 150 may include chromium (Cr) based-metal, aluminum (Al) based-metal, silver (Ag) based-metal, tin (Sn) based-metal, molybdenum (Mo) based-metal, iron (Fe) based-metal, platinum (Pt) based-metal, mercury (Hg) based-metal, etc. These may be used alone or in a combination thereof. Since the second semiconductor device 192 may include the second gate electrode 160 having the second gate electrode layer portion 150 containing the opaque conductive material, the second semiconductor device 192 may have the second transmittance substantially lower than the first transmittance of the first semiconductor device 190, and thus may reflect the light emitted from the organic light emitting structure.

A third gate electrode layer portion 145 may be disposed on the gate insulation layer 130 in the third region III. In example embodiments, the third gate electrode layer portion 145 may be substantially overlapped over the third active layer portion 145 by interposing the gate insulation layer 130 therebetween. The third gate electrode layer portion 145 may include a material substantially the same as that of the first gate electrode layer portion 140. Additionally, a fourth gate electrode layer portion 155 may be disposed on the third gate electrode layer portion 145. The fourth gate electrode layer portion 155 may include a material substantially the same as that of the second gate electrode layer portion 150. Thus, the third gate electrode 165 may have a configuration in which the third gate electrode layer portion 145 and the fourth gate electrode layer portion 155 are sequentially stacked. The third gate electrode 165 may reflect the light emitted from the organic light emitting structure. As described above, the third semiconductor 194 may include the third gate electrode 165 having the fourth gate electrode layer portion 155 containing the substantially opaque conductive material, so that the third semiconductor device 194 may have the third transmittance substantially lower than the first transmittance of the first semiconductor device 190.

As illustrated above, the second gate electrode 160 of the second semiconductor device 192 and the third gate electrode 165 of the third semiconductor device 194 may reflect the light emitted from the organic light emitting structure. Thus, the generation of photo currents due to the light may be prevented in the second active layer portion 120 and the third active layer portion 125. In addition, the second gate electrode 160 of the second semiconductor device 192 and the third gate electrode 165 of the third semiconductor device 194 may have the multi-layered structures, respectively, so that threshold voltages of the second and the third semiconductor devices 192 and 194 may be uniformly maintained. As a result, the second semiconductor device 192 and the third semiconductor device 194 may ensure improved reliabilities.

The insulating interlayer 170 may be disposed on the gate insulation layer 130 to cover the first gate electrode 135, the first gate electrode layer portion 140, and the third gate electrode layer portion 145. The insulating interlayer 170 may electrically insulate the first gate electrode 135 from the first source electrode 175a and the first drain electrode 175b. Additionally, the insulating interlayer 170 may electrically insulate the first gate electrode layer portion 140 from the second source electrode 180a and the second drain electrode 180b. Furthermore, the insulating interlayer 170 may electrically insulate the third gate electrode layer portion 145 from the third source electrode 185a and the third drain electrode 185b. For example, the insulating interlayer 170 may include silicon compound, transparent resin, etc.

The first source electrode 175a, the first drain electrode 175b, the second source electrode 180a, the second drain electrode 180b, the third source electrode 185a, and the third drain electrode 185b may be disposed on the insulating interlayer 170. For example, each of the first source and drain electrodes 175a and 175b, the second source and drain electrodes 180a and 180b, and the third source and drain electrodes 185a and 185b may include metal, alloy, metal nitride, conductive metal oxide, a material having a transmittance. As the formations of the first source and drain electrodes 175a and 175b on the insulating interlayer 170, the first semiconductor device 190 may be provided in the first region I of the substrate 105. The first semiconductor device 190 may include the first active layer portion 115, the gate insulation layer 130, the first gate electrode 135, the insulating interlayer 170, the first source electrode 175a, and the first drain electrode 175b. For example, the first semiconductor device 190 may serve as a sensing thin film transistor in a display device.

According to the formations of the second source and drain electrodes 180a and 180b on the insulating interlayer 170, the second semiconductor device 192 may be provided in the second region II of the substrate 105. The second semiconductor device 192 may include the second active layer portion 120, the gate insulation layer 130, the second gate electrode 160 having the first gate electrode layer portion 140 and the second gate electrode layer portion 150, the insulating interlayer 170, the second source electrode 180a, and the second drain electrode 180b. For example, the second semiconductor device 192 may function as a switching thin film transistor in the display device.

According as the third source electrode 185a and the third drain electrode 185b are formed on the insulating interlayer 170, the third semiconductor device 194 may be provided in the third region III of the substrate 105. The third semiconductor device 194 may include the third active layer portion 125, the gate insulation layer 130, the third gate electrode 165 having the third gate electrode layer portion 145 and the fourth gate electrode layer portion 155, the insulating interlayer 170, the third source electrode 185a, and the third drain electrode 185b. For example, the third semiconductor device 194 may serve as a driving thin film transistor.

Another display panel including a plurality of semiconductor devices having substantially the same transmittance may be provided as an example. In this example case, one of the semiconductor devices may sense a light emitted from an organic light emitting structure, another semiconductor device may output a data signal from the semiconductor device sensing the light, and other semiconductor devices may control a current flowing in the organic light emitting structure in accordance with the data signal. Each of gate electrodes of these semiconductor devices may include the same material with a relatively low transmittance. However, the semiconductor device sensing the light may have a lower sensing ability when the gate electrode of such a semiconductor device includes the material having the relatively low transmittance. Meanwhile, in this example, when the gate electrodes of the semiconductor devices include a material having a relatively high transmittance, reliabilities of other semiconductor devices may be reduced even though the semiconductor device sensing the light may have a higher sensing ability.

To differentiate from the display panel of the above mentioned example, the display panel 100 according to example embodiments of the invention may include the plurality of semiconductor devices (e.g., the first semiconductor device 190, the second semiconductor device 192 and the third semiconductor device 194) with different transmittance. Here, the first semiconductor device 190 serving as the sensing transistor may locate in the first region I of the substrate 105, and may include the first active layer portion 115, the gate insulation layer 130, the first gate electrode 135, the insulating interlayer 170, the first source electrode 175a, and the first drain electrode 175b. The second semiconductor device 192 serving as the switching transistor may be disposed in the second region II of the substrate 105, and may include the second active layer portion 120, the gate insulation layer 130, the second gate electrode 160 having the first gate electrode layer portion 140 and the second gate electrode layer portion 150, the insulating interlayer 170, the second source electrode 180a, and the second drain electrode 180b. The third semiconductor 194 serving as the driving transistor may be disposed in the third region III of the substrate 105, and may include a third active layer portion 125, the gate insulation layer 130, a third gate electrode 165, the insulating interlayer 170, a third source electrode 185a, and a third drain electrode 185b. The first gate electrode 135 including the transparent conductive material may have the first transmittance. The second gate electrode 160 and the third gate electrode 165 of the third semiconductor device 194 including the opaque conductive materials may have the second transmittance and the third transmittance, respectively. The second and the third transmittances may be substantially lower than the first transmittance. Therefore, the first gate electrode 135 of the first semiconductor device 190 may transmit the light emitted from the organic light emitting structure, so that the first semiconductor 190 may efficiently sense the light. Further, the second gate electrode 160 of the second semiconductor device 192 and the third gate electrode 165 of the third semiconductor device 194 may reflect the light, such that the photo currents generated in the second and the third active layer portions 120 and 125 may be reduced. Since the second gate electrode 160 and the third gate electrode 165 may have the multi-layered structures, the threshold voltages of the second and the third semiconductor devices 192 and 194 may be substantially uniformly maintained. As a result, the second and the third semiconductor devices 192 and 194 may ensure enhanced reliabilities.

FIGS. 2 to 8 are cross sectional views illustrating a method of manufacturing a display panel in accordance with example embodiments.

Figure 2:
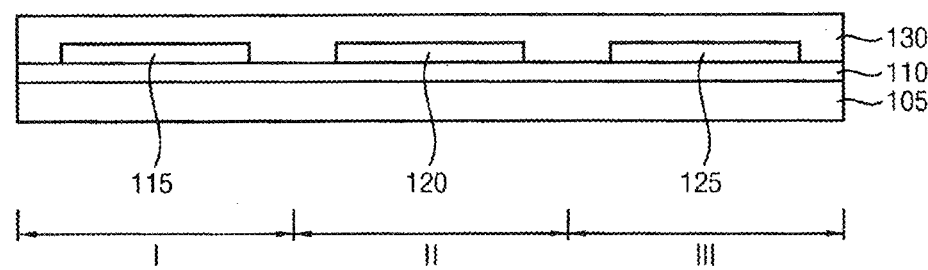
FIGS. 2 to 8 are cross sectional views illustrating a method of manufacturing a display panel in accordance with example embodiments.

Referring to FIG. 2, a buffer layer 110 may be formed on a substrate 105. In example embodiments, the substrate 105 may have a first region I, a second region II and a third region III. The buffer layer 110 may be formed using silicon compound, transparent resin, etc.

A first active layer portion 115, a second active layer portion 120 and a third active layer portion 125 may be formed on the buffer layer 110. In example embodiments, the first active layer portion 115, the second active layer portion 120 and the third active layer portion 125 may be formed in the first region I, in the second region II and in the third region III, respectively. Each of the first to the third active layer portions 115, 120 and 125 may be formed using amorphous silicon, amorphous silicon containing impurities, etc. Alternatively, each of the first to the third active layer portions 115, 120 and 125 may be formed using oxide semiconductor.

As illustrated in FIG. 2, a gate insulation layer 130 may be formed on the buffer layer to cover the first to the third active layer portions 115, 120 and 125. That is, the gate insulation layer 130 may be formed in the first to the third regions I, II and III. The gate insulation layer 130 may be formed using silicon compound such as silicon oxide, silicon carbon oxide, etc.

Figure 3:
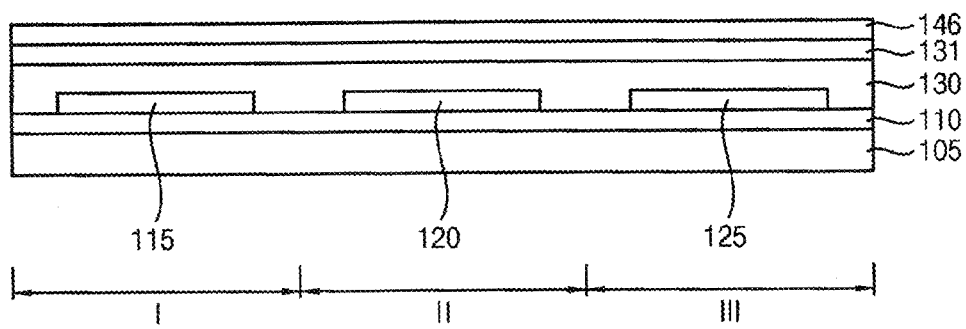

Referring to FIG. 3, a first electrode material layer 131 may be formed on the gate insulation layer 130, and then a second electrode material layer 146 may be formed on the first electrode material layer 131. In example embodiments, the first electrode material layer 131 may be formed using a substantially transparent conductive material. For example, the first electrode material layer 131 may be formed using indium tin oxide, indium zinc oxide, zinc oxide, tin oxide, gallium oxide and/or indium oxide. The first electrode material layer 131 may be obtained by a sputtering process, a chemical vapor deposition process, a pulse laser deposition process, a vapor deposition process, an atomic layer deposition process, etc. The second electrode material layer 146 may be formed using an opaque conductive material. For example, the second electrode material layer 146 may be formed using chromium (Cr) based-metal, aluminum (Al) based-metal, silver (Ag) based-metal, tin (Sn) based-metal, molybdenum (Mo) based-metal, iron (Fe) based-metal, platinum (Pt) based-metal, mercury (Hg) based-metal, etc. The second electrode material layer 146 may be formed by a sputtering process, a chemical vapor deposition process, a pulse laser deposition process, a vapor deposition process, an atomic layer deposition process, etc.

Figure 4:
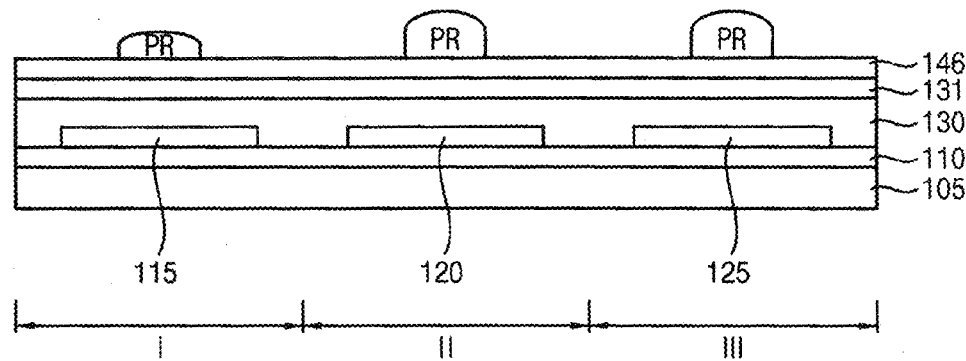

Referring to FIG. 4, a photoresist layer portions PR may be formed on the second electrode material layer 146. A half-ton mask (not illustrated) or a half-ton slit mask (not illustrated) having a blocking portion, a semi-transmitting portion and a transmitting portion may be placed over the second electrode material layer 146.

Figure 5:
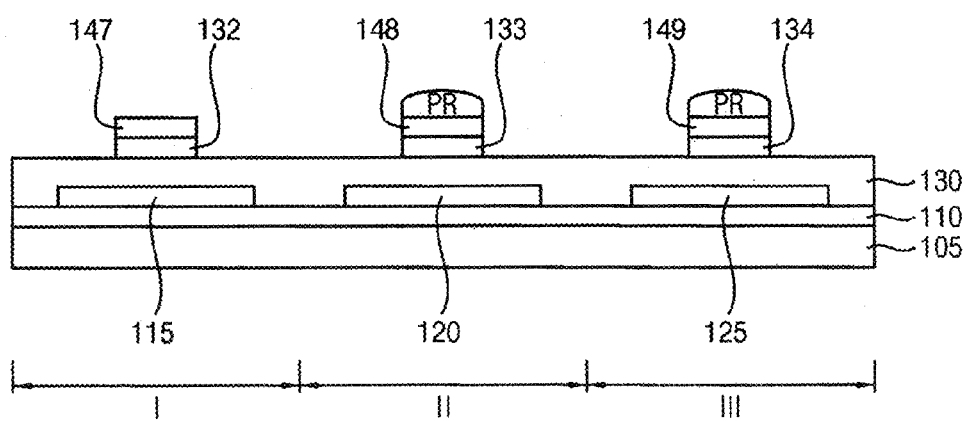

Referring to FIG. 5, the second electrode material layer 146 and the first electrode material layer 131 may be etched using the half-ton mask or the half-ton slit mask. Thus, preliminary first gate electrodes 132 and 147, preliminary second gate electrodes 133 and 148 and preliminary third gate electrodes 134 and 149 may be formed on the gate insulation layer 130.

Figure 6:
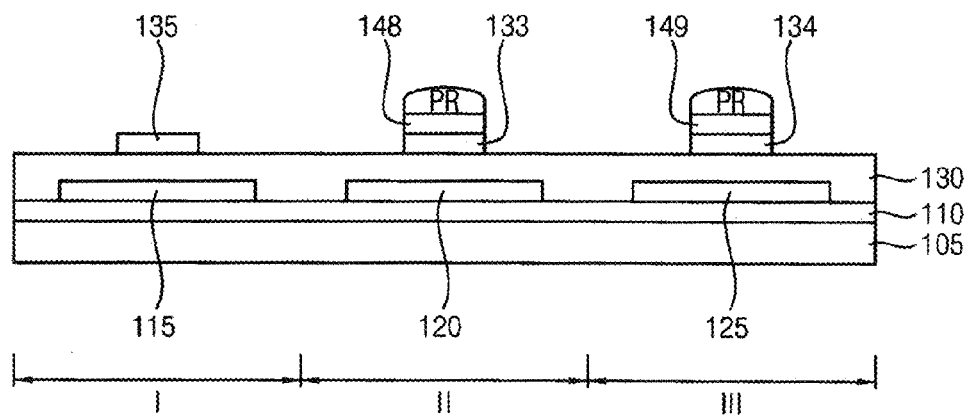

Referring to FIG. 6, the photoresist layer portion PR for forming the first gate electrode may be removed and also an exposed portion of the second electrode material layer 146 (i.e., the preliminary first gate electrode 147) may be removed, so a first gate electrode 135 may be provided on the gate insulation layer 130 in the first region I.

Figure 7:
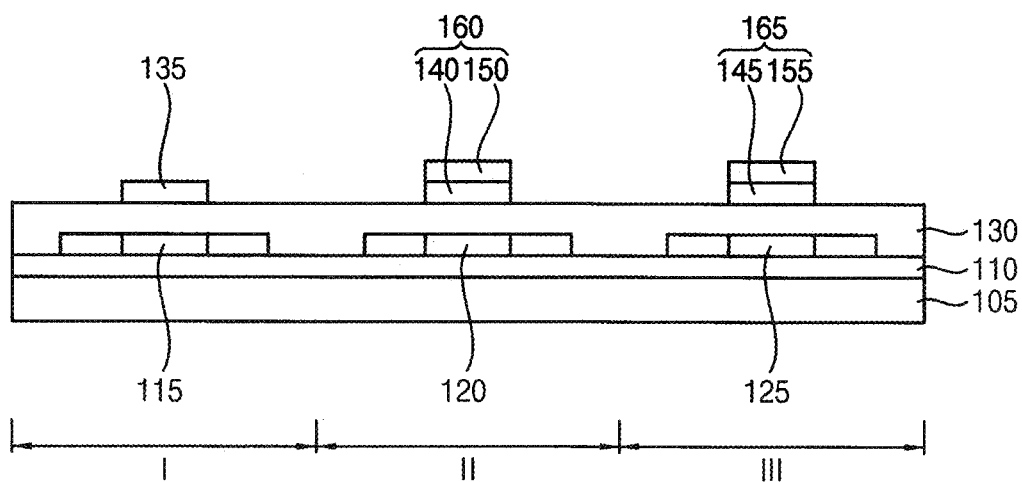

Referring to FIG. 7, the photoresist layer portions PR for forming the second and third gate electrodes may be removed, so that a second gate electrode 160 including a first gate electrode layer portion 140 and a second gate electrode layer portion 150 may be provided on the gate insulation layer 130 in the second region II. In addition, a third gate electrode 165 including a third gate electrode layer portion 145 and a fourth gate electrode layer portion 155 may be provided on the gate insulation layer 130 in the third region III. In example embodiments, the second and the third gate electrodes 160 and 165 may be formed while forming the first gate electrode, such that no additional process and no additional mask may be required. Therefore, a manufacturing cost for the display panel may be reduced and a manufacturing process of the display panel may be simplified.

Figure 8:
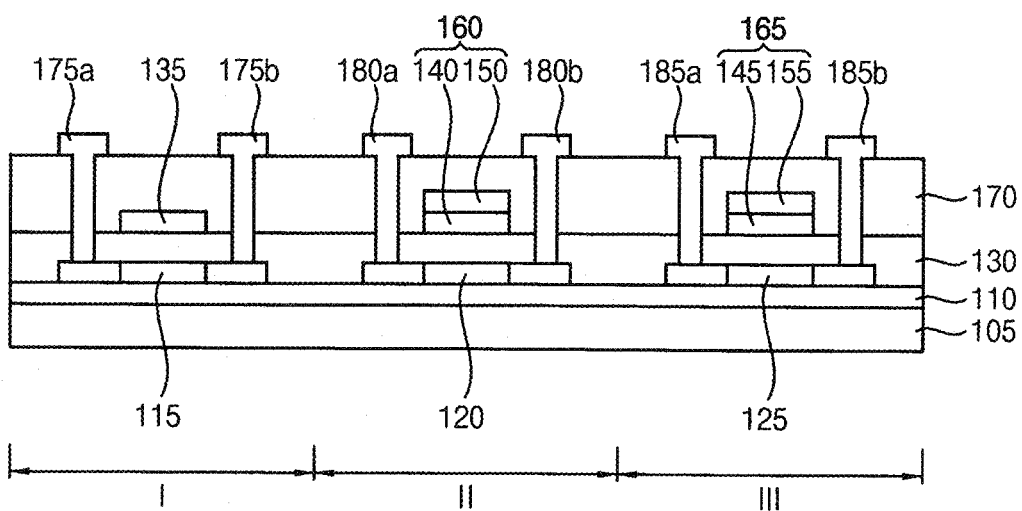

Referring to FIG. 8, an insulating interlayer 170 may be formed on the gate insulation layer 130 to cover the first gate electrode 135, the second gate electrode 160 and the third gate electrode 165. The insulating interlayer 170 may be formed using silicon compound, transparent resin, etc.

The gate insulation layer 130 and the insulating interlayer 170 may be partially etched to form a plurality of contact holes. In this case, the contact holes may expose a source region of the first active layer portion 115, a drain region of the first active layer portion 115, a source region of the second active layer portion 120, a drain region of the second active layer portion 120, a source region of the third active layer portion 125, and a drain region of the third active layer portion 125. The contact holes may be filled with a first source electrode 175a, a first drain electrode 175b, a second source electrode 180a, a second drain electrode 180b, a third source electrode 185a, and a third drain electrode 185b, respectively. Therefore, the first to the third source electrodes 175a, 180a and 185a may contact the source regions of the first to the third active layer portions 115, 120 and 125 through the contact holes, respectively. Further, the first to the third drain electrodes 175b, 180b and 185b may contact the drain regions of the first to the third active layer portions 115, 120 and 125 through the contact holes, respectively.

As illustrated in FIG. 8, as the first source electrode 175a and the first drain electrode 175b may be formed, a first semiconductor device 190 may be provided in the first region I of the substrate 105. Additionally, a second semiconductor device 192 may be provided in the second region II of the substrate 105 according to the formations of the second source electrode 180a and the second drain electrode 180b. Furthermore, as the formations of the third source electrode 185a and the third drain electrode 185b, the third semiconductor device 194 may be provided in the third region III of the substrate 105. For example, the first, the second and the third semiconductor devices 190, 192 and 194 may serve as a sensing transistor, a switching transistor and a driving transistor, respectively.

Figure 9:
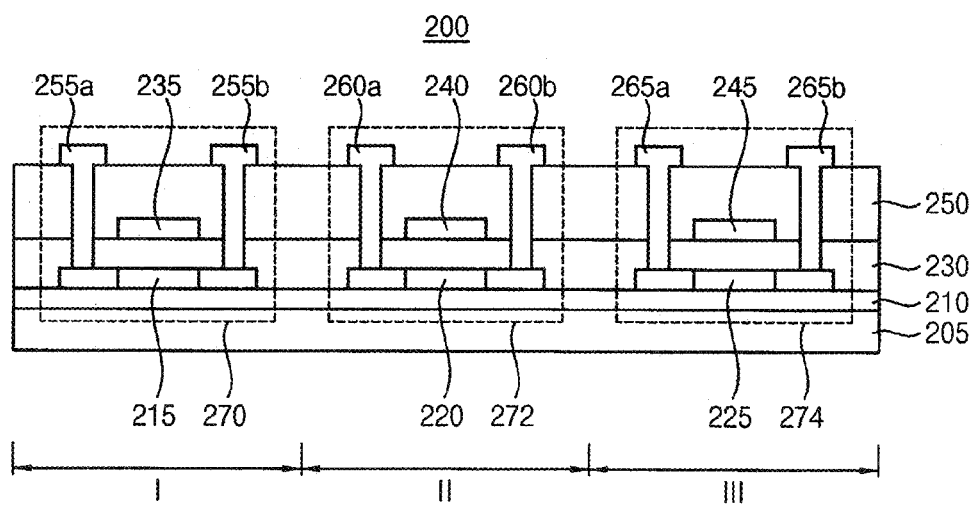
FIG. 9 is a cross sectional view illustrating a display panel in accordance with some example embodiments.

FIG. 9 is a cross sectional view illustrating a display panel in accordance with some example embodiments. The display panel 200 illustrated in FIG. 9 may have a configuration substantially the same as or similar to that of the display panel 100 described with reference to FIG. 1 except a second gate electrode 240 and a third gate electrode 245.

Referring to FIG. 9, a first gate electrode 235 may be disposed on a gate insulation layer 230. The first gate electrode 235 may be positioned in a first region I of a substrate 205. The first gate electrode 235 may be substantially overlapped over a first active layer portion 215 by interposing the gate insulation layer 230 therebetween. For example, the first gate electrode 235 may include a transparent conductive material, so that the first gate electrode 235 may have a first transmittance. In example embodiments, the first transmittance may be substantially greater than a second transmittance of a second gate electrode 240 and a third transmittance of a third gate electrode 245. The first gate electrode 235 may efficiently transmit a light generated from an organic light emitting structure of a display device, and thus a first semiconductor device 270 including the first gate electrode 235 may have an improved light sensing efficiency.

The second gate electrode 240 may be disposed on the gate insulation layer 230. The second gate electrode 240 may locate in a second region II of the substrate 205. The second gate electrode 240 may be substantially overlapped over a second active layer portion 220 by interposing the gate insulation layer 230 therebetween. The second gate electrode 240 may include an opaque conductive material, so that the second gate electrode 240 may have the second transmittance substantially lower than the first transmittance of the first gate electrode 235. Thus, the second gate electrode 240 may reflect the light emitted from the organic light emitting structure.

The third gate electrode 245 may be positioned on the gate insulation layer 230. The third gate electrode 245 may be disposed in a third region III of the substrate 205. The third gate electrode 245 may be substantially overlapped over a third active layer portion 225 and the gate insulation layer 230 may be interposed between the third active layer portion 225 and the third gate electrode 245. The third gate electrode 245 may include a material substantially the same as that of the second gate electrode 240. The third gate electrode 245 may have the third transmittance substantially lower than the first transmittance of the first gate electrode 235. Hence, the third gate electrode 245 may also reflect the light emitted from the organic light emitting structure.

As described above, each of the second and the third gate electrodes 240 and 245 may have a relatively simple structure (e.g., a single-layered structure) compared to the second and the third gate electrodes 160 and 165 illustrated in FIG. 1.

FIGS. 10 to 15 are cross sectional views illustrating a method of manufacturing a display panel in accordance with some example embodiments. The method of forming the display panel illustrated in FIGS. 10 to 15 is substantially the same as or similar to those with reference to FIGS. 3 to 8.

Figure 10:
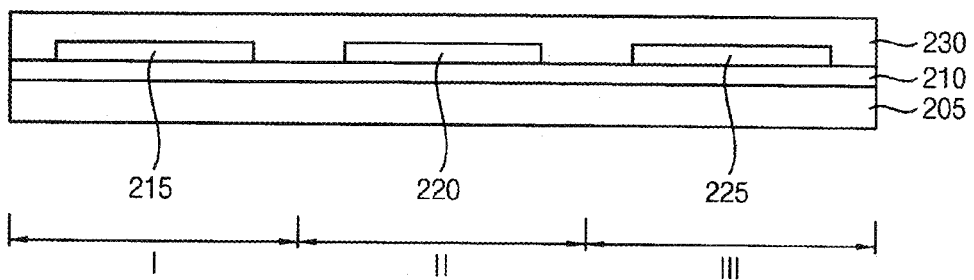
FIGS. 10 to 15 are cross sectional views illustrating a method of manufacturing a display panel in accordance with some example embodiments.

Referring to FIG. 10, a buffer layer 210 may be formed on a substrate 205 having a first region I, a second region II and a third region III. A first active layer portion 215, a second active layer portion 220 and a third active layer portion 225 may be formed on the buffer layer 210. The first active layer portion 215, the second active layer portion 220 and the third active layer portion 225 may be formed in the first region I, in the second region II and in the third region III, respectively. For example, each of the first to the third active layer portions 215, 220 and 225 may be formed using amorphous silicon, amorphous silicon containing impurities, oxide semiconductor, etc.

A gate insulation layer 230 may be formed on the buffer layer 210 to cover the first to the third active layer portions 215, 220 and 225. For example, the gate insulation layer 230 may be formed using silicon compound such as silicon oxide, silicon carbon oxide, etc.

Figure 11:
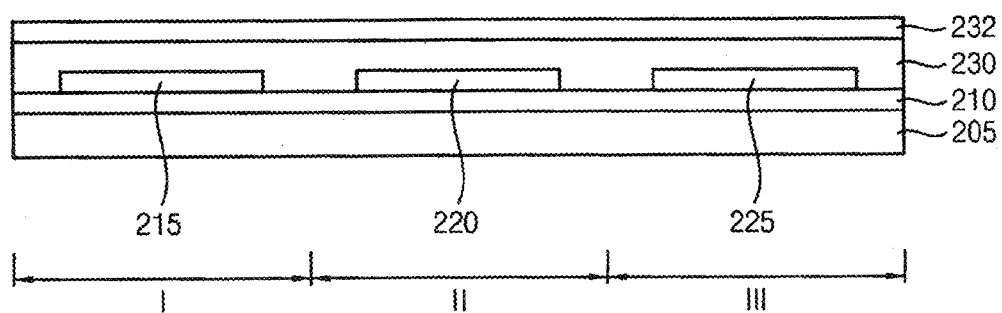

Referring to FIG. 11, a first electrode material layer 232 may be formed on the gate insulation layer 230. For example, the first electrode material layer 232 may be formed using a transparent conductive material such as indium tin oxide, indium zinc oxide, zinc oxide, tin oxide, gallium oxide, indium oxide, etc.

Figure 12:
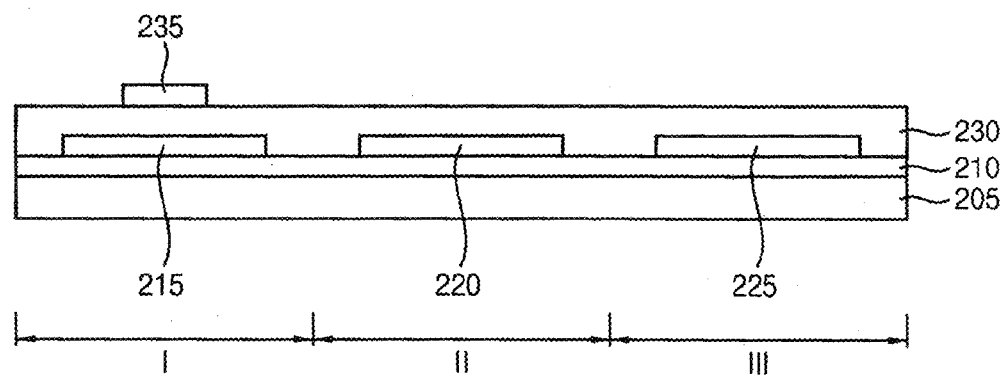

Referring to FIG. 12, a first gate electrode 235 may be formed on the gate insulation layer 230 by patterning the first electrode material layer 232. The first gate electrode 235 may be positioned on a portion of the gate insulation layer 230 under which the first active layer portion 215 is located. In other words, the first gate electrode 235 may be substantially overlapped over the first active layer portion 215 while interposing the gate insulation layer 230 between the first active layer portion 215 and the first gate electrode 235.

Figure 13:
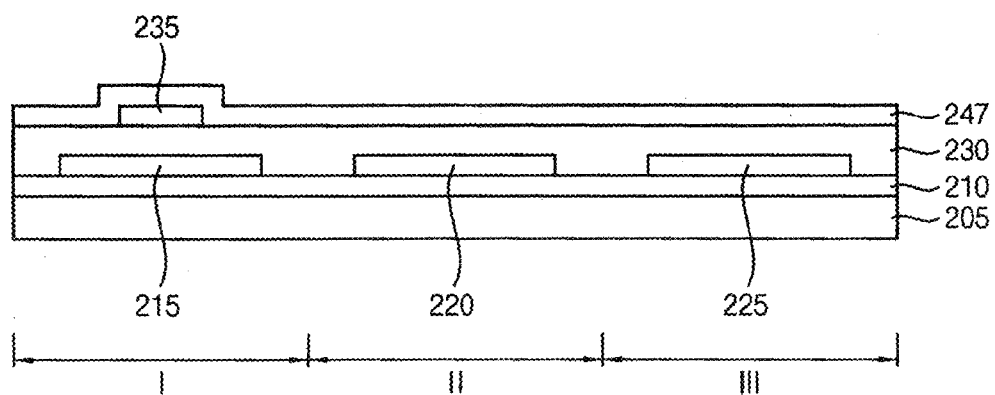

Referring to FIG. 13, a second electrode material layer 247 may be formed on the gate insulation layer 230 to cover the first gate electrode 235. In example embodiments, the second electrode material layer 247 may be formed using an opaque conductive material. Examples of the opaque conductive material for the second electrode material layer 247 may include chromium based-metal, aluminum based-metal, silver based-metal, tin based-metal, molybdenum based-metal, iron based-metal, platinum based-metal, mercury based-metal, etc.

Figure 14:
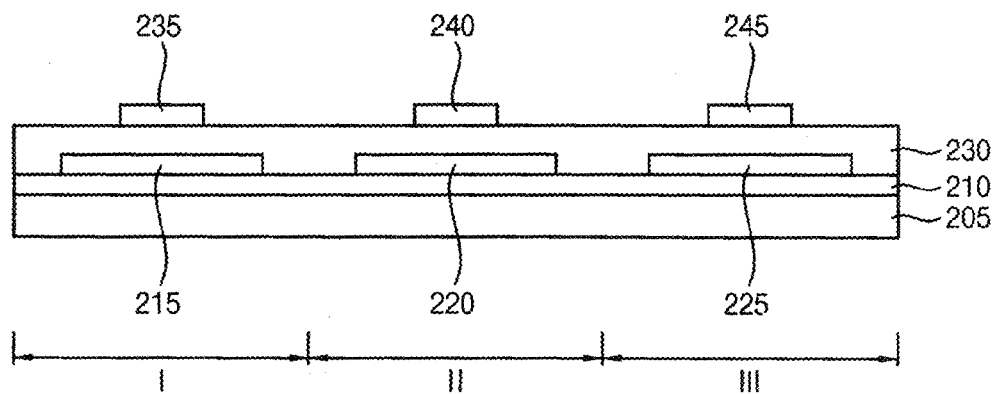

Referring to FIG. 14, a second gate electrode 240 and a third gate electrode 245 may be formed on the gate insulation layer 230 by patterning the second electrode material layer 247. The second gate electrode 240 may be provided on a portion of the gate insulation layer 230 under which the second active layer portion 220 is located. In addition, the third gate electrode 245 may be positioned on a portion of the gate insulation layer 230 under which the third active layer portion 225 is formed. As such, the second gate electrode 240 and the third gate electrode 245 may have simplified structures so that processes of manufacturing the second semiconductor device 272 (see FIG. 9) and the third semiconductor device 274 (see FIG. 9) may be simplified. Further, manufacturing cost for display panel may be reduced.

Figure 15:
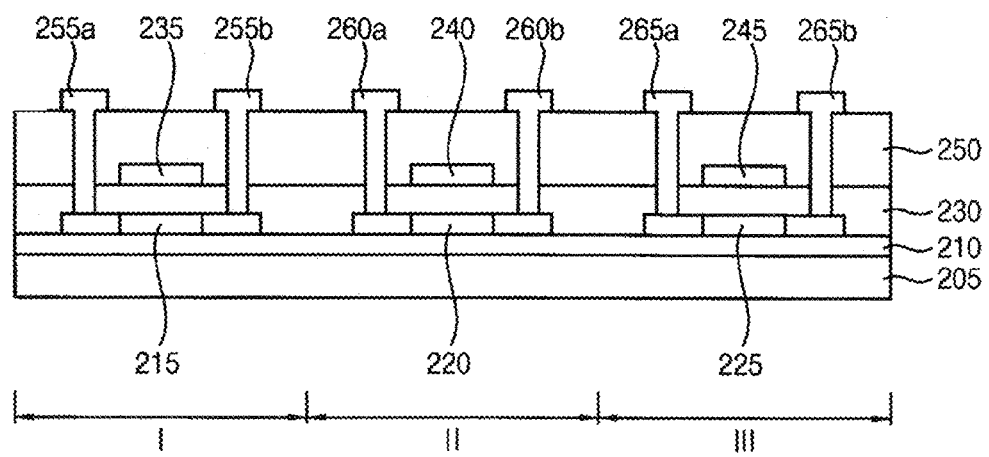

Referring to FIG. 15, an insulating interlayer 270 may be formed on the gate insulation layer 230 to cover the first to the third gate electrodes 235, 240 and 245. A first source electrode 255a, a first drain electrode 255b, a second source electrode 260a, a second drain electrode 260b, a third source electrode 265a, and a third drain electrode 265b may be formed on the insulating interlayer 270. The first source and drain electrodes 255a and 255b may make contact with the first active layer portion 215 through the insulating interlayer 270 and the gate insulation layer 230. The second source and drain electrodes 260a and 260b may contact the second active layer portion 220 through the insulating interlayer 270 and the gate insulation layer 230. The third source and drain electrodes 265a and 265b may contact the third active layer portion 225 through the insulating interlayer 270 and the gate insulation layer 230.

As illustrated in FIG. 15, the first semiconductor device 270 (see FIG. 9) may be provided in the first region I after forming of the first source electrode 255a and the first drain electrode 255b. The second semiconductor device 272 may also be provided in the second region II by forming the second source electrode 260a and the second drain electrode 260b. Moreover, the third semiconductor device 274 may be provided in the third region III according to the formations of the third source electrode 265a and the third drain electrode 265b. For example, the first to the third semiconductor devices 270, 272 and 274 may serve as a sensing transistor, a switching transistor and a driving transistor, respectively.

Figure 16:
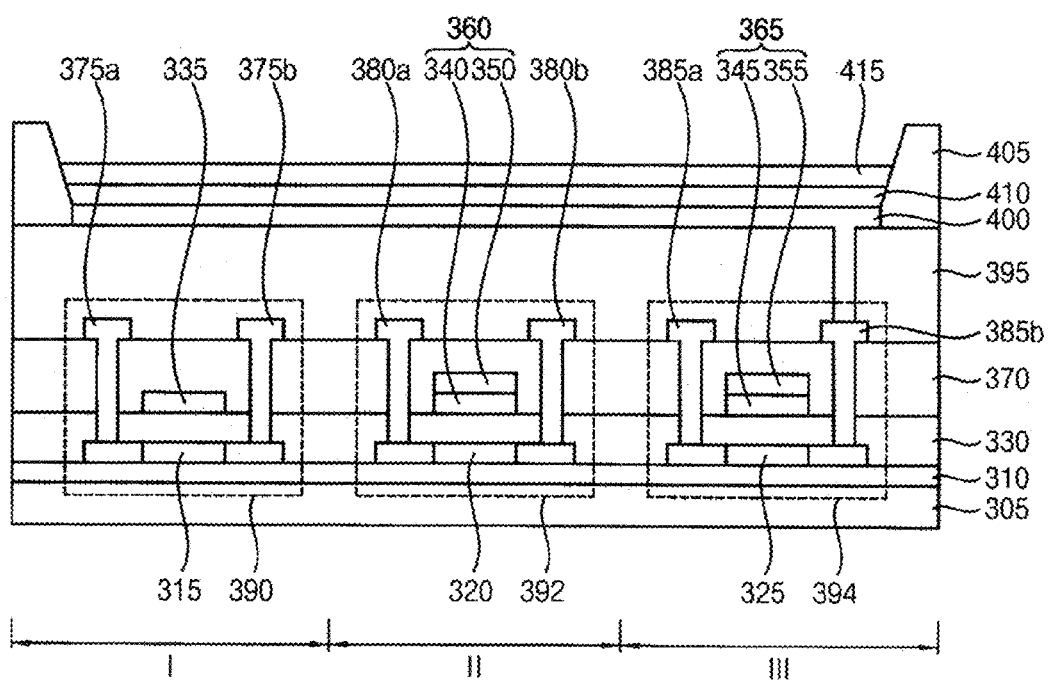
FIG. 16 is a cross sectional view illustrating an organic light emitting display device in accordance with example embodiments.

FIG. 16 is a cross sectional view illustrating an organic light emitting display device in accordance with example embodiments. Although the organic light emitting display device illustrated in FIG. 16 may include a display panel substantially the same as or similar to the display panel 100 described with reference to FIG. 1, those ordinary skilled in the art could understand that the organic light emitting display device in FIG. 16 may include the display panel 200 described with reference to FIG. 9. Descriptions of components and/or structures in FIG. 16 substantially the same as or similar to those of FIG. 1 will be omitted.

Referring to FIG. 16, the organic light emitting display device may include a substrate 305, a first semiconductor device 390, a second semiconductor device 392, a third semiconductor device 394, a first electrode 400, an organic light emitting structure 410, a second electrode 415, etc.

An insulation layer 395 may be disposed over the substrate 305 to cover the first to the third semiconductor devices 390, 392 and 394. The insulation layer 395 may include an organic material or an inorganic material.

The first electrode 400 may be disposed on the insulation layer 395. For example, the first electrode 400 may include a material having a transmittance. Alternatively, the first electrode 400 may include a material having a reflectivity.

A pixel defining layer 405 may be positioned on the first electrode 400. The pixel defining layer 405 may include an opening partially exposing the first electrode 400. The pixel defining layer 405 may include an organic material or an inorganic material.

The organic light emitting structure 410 may be disposed on the first electrode 400 exposed by the opening of the pixel defining layer 405. An organic light emitting layer of the organic light emitting structure 410 may be formed using a light emitting material for generating several colors of light in accordance with pixels of the organic light emitting display device. Alternatively, the organic light emitting layer of the organic light emitting structure 410 may include a plurality of stacked light emitting materials generating different colors of light to thereby emitting a white color of light.

The second electrode 415 may be located on the pixel defining layer 405 and the organic light emitting structure 410. The second electrode 415 may include a material substantially the same as that of the first electrode 400.

Example embodiments of the invention may be employed in any electronic device including a display panel. For example, the organic light emitting display device according to example embodiments may be used in a notebook computer, a laptop computer, a digital camera, a video camcorder, a cellular phone, a smart phone, a smart pad, a portable multimedia player (PMP), a personal digital assistant (PDA), a MP3 player, a navigation system, a television, a computer monitor, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display panel comprising:
   a substrate comprising a major surface which comprises a first region, a second region and a third region when viewed in a direction perpendicular to the major surface;
   a first semiconductor device disposed over the first region of the substrate and comprising:
      a first active layer portion;
      a gate insulation layer covering the first active layer portion;
      a first gate electrode disposed over the gate insulation layer, the first gate electrode of the first semiconductor device comprising a substantially transparent conductive material and having a first transmittance; and
      a first source electrode and a first drain electrode contacting the first active layer portion;
   a second semiconductor device disposed over the second region of the substrate and comprising a second gate electrode, the second gate electrode of the second semiconductor device having a second transmittance substantially different from the first transmittance; and
   a third semiconductor device disposed over the third region of the substrate and comprising a third gate electrode, the third gate electrode of the third semiconductor device having a third transmittance substantially different from the first transmittance.

2. The display panel of claim 1, wherein the first transmittance is substantially greater than the second transmittance and the third transmittance.

3. The display panel of claim 2, wherein the second transmittance is substantially identical to the third transmittance.

4. The display panel of claim 1, wherein the second semiconductor device comprises:
- a second active layer portion;
- the gate insulation layer covering the second active layer portion;
- the second gate electrode disposed over the gate insulation layer, the second gate electrode comprising a first gate electrode layer portion comprising a substantially transparent conductive material and a second gate electrode layer portion comprising a substantially opaque conductive material disposed over the first gate electrode layer portion; and
- a second source electrode and a second drain electrode contacting the second active layer portion.

5. The display panel of claim 4, wherein the third semiconductor device comprises:
- a third active layer portion;
- the gate insulation layer covering the third active layer portion;
- the third gate electrode disposed over the gate insulation layer, the third gate electrode comprising a third gate electrode layer portion comprising a substantially transparent conductive material and a fourth gate electrode layer portion comprising a substantially opaque conductive material disposed over the third gate electrode layer portion; and
- a third source electrode and a third drain electrode contacting the third active layer portion.

6. The display panel of claim 5, wherein each of the substantially transparent conductive materials comprises at least one selected from the group consisting of indium tin oxide, indium zinc oxide, zinc oxide, tin oxide, gallium oxide and indium oxide.

7. The display panel of claim 5, wherein each of the substantially opaque conductive materials comprises at least one selected from the group consisting of chromium (Cr) based-metal, aluminum (Al) based-metal, silver (Ag) based-metal, tin (Sn) based-metal, molybdenum (Mo) based-metal, iron (Fe) based-metal, platinum (Pt) based-metal and mercury (Hg) based-metal.

8. The display panel of claim 1, wherein the second semiconductor device comprises:
- a second active layer portion;
- the gate insulation layer covering the second active layer portion;
- the second gate electrode disposed over the gate insulation layer, the second gate electrode comprising a substantially opaque conductive material; and
- a second source electrode and a second drain electrode contacting the second active layer portion.

9. The display panel of claim 8, wherein the third semiconductor device comprises:
- a third active layer portion;
- the gate insulation layer covering the third active layer portion;
- the third gate electrode disposed over the gate insulation layer, the third gate electrode comprising a substantially opaque conductive material; and
- a third source electrode and a third drain electrode contacting the third active layer portion.

10. An organic light emitting display device comprising:
the display panel of claim 1;
a first electrode disposed over the substrate and contacting the third semiconductor device;
an organic light emitting structure disposed over the first electrode; and
a second electrode disposed over the organic light emitting structure.

* * * * *